United States Patent
Chen et al.

(10) Patent No.: US 9,324,664 B2
(45) Date of Patent: Apr. 26, 2016

(54) EMBEDDED CHIP PACKAGE STRUCTURE

(71) Applicant: Unimicron Technology Corp., Taoyuan (TW)

(72) Inventors: Tsung-Yuan Chen, Taoyuan County (TW); Wei-Ming Cheng, Kaohsiung (TW)

(73) Assignee: Unimicron Technology Corp., Taoyuan (TW)

( * ) Notice: Subject to any disclaimer, the term of this patent is extended or adjusted under 35 U.S.C. 154(b) by 146 days.

(21) Appl. No.: 13/773,647

(22) Filed: Feb. 22, 2013

(65) Prior Publication Data

US 2014/0239463 A1 Aug. 28, 2014

(51) Int. Cl.
| | | |
|---|---|---|
| *H01L 23/48* | (2006.01) | |
| *H01L 23/60* | (2006.01) | |
| *H01L 23/00* | (2006.01) | |

(52) U.S. Cl.
CPC .................. *H01L 23/60* (2013.01); *H01L 24/24* (2013.01); *H01L 24/82* (2013.01); *H01L 24/83* (2013.01); *H01L 2224/18* (2013.01); *H01L 2924/0002* (2013.01)

(58) Field of Classification Search
CPC ....................................................... H01L 23/60
USPC .......... 257/432, 466, 496, 659; 361/790, 795; 438/106, 107, 129
See application file for complete search history.

(56) References Cited

U.S. PATENT DOCUMENTS

| | | | |
|---|---|---|---|
| 5,422,513 A * | 6/1995 | Marcinkiewicz et al. | 257/668 |
| 2006/0237225 A1* | 10/2006 | Kariya et al. | 174/260 |
| 2008/0224320 A1* | 9/2008 | Palmade et al. | 257/773 |
| 2009/0188703 A1* | 7/2009 | Ito et al. | 174/255 |
| 2011/0284267 A1* | 11/2011 | Chang | 174/250 |
| 2012/0018857 A1* | 1/2012 | McConnelee et al. | 257/659 |

FOREIGN PATENT DOCUMENTS

| | | |
|---|---|---|
| TW | I237883 | 8/2005 |
| TW | 200733842 | 9/2007 |
| TW | 200944072 | 10/2009 |
| TW | I353650 | 12/2011 |
| TW | 201248744 | 12/2012 |

OTHER PUBLICATIONS

"Office Action of Taiwan Counterpart Application", issued on May 21, 2014, p. 1-p. 10.

* cited by examiner

*Primary Examiner* — William Harriston
(74) *Attorney, Agent, or Firm* — Jianq Chyun IP Office (57) ABSTRACT

An embedded chip package structure including a core layer, a chip, a first circuit layer and a second circuit layer is provided. The core layer includes a first surface, a second surface opposite to each other and a chip container passing through the first surface and the second surface. The chip is disposed in the chip container. The chip includes an active surface and a protrusion and a top surface of the protrusion is a part of the active surface. The first circuit layer is disposed on the first surface and electrically connected to the core layer and the chip. The first circuit layer has a through hole. The protrusion of the chip is situated within the through hole, and the top surface of the protrusion is exposed to receive an external signal. The second circuit layer is disposed on the second surface and electrically connected to the core layer.

9 Claims, 14 Drawing Sheets

EMBEDDED CHIP PACKAGE STRUCTURE

TECHNICAL FIELD

The present invention relates to a chip package structure, and more particularly relates to an embedded chip package structure.

BACKGROUND

In general, the circuit board is formed by laminating a plurality of patterned circuit layers and dielectric layers in alternation. The patterned circuit layers are fabricated by patterning the copper foils through the lithography and etching processes. The dielectric layers are disposed between the patterned circuit layers to isolate the patterned circuit layers. The stacked patterned circuit layers are electrically connected through the plating through holes or conductive vias penetrating the dielectric layer(s). Then, the chip is disposed on the surface of the circuit board and electrically connected through the internal circuit for signal transmission. However, along with the market demands, the design of the chip package structure move toward lightness, compactness and portability, and the surface area of the circuit board available for chip mounting is very limited.

Because the chip is generally soldered to the circuit board of the package structure and the electro-magnetic interference (EMI) exists, a faraday cage is commonly placed to shield the EMI. The principle of the faraday cage is to apply a conductive shield (such as, a metal cover) to reflect the electrical interference or transfer the electrical interference to the ground. Nevertheless, the faraday cage surrounding the chip also increase the size and weight of the chip package structure, which is adverse to minimization of the chip package structure.

SUMMARY

The present invention provides an embedded chip package structure, which has the electro-magnetic shield with a reduced height of the whole chip package.

The present invention provides an embedded chip package structure, including a core layer, a chip, a first circuit layer and a second circuit layer. The core layer includes a first surface, a second surface opposite to each other and a chip container passing through the first surface and the second surface. The chip is disposed in the chip container. The chip includes an active surface and a protrusion and a top surface of the protrusion is a part of the active surface. The first circuit layer is disposed on the first surface and electrically connected to the core layer and the chip. The first circuit layer has a through hole. The protrusion of the chip is situated within the through hole, and the top surface of the protrusion is exposed to receive an external signal. The second circuit layer is disposed on the second surface and electrically connected to the core layer.

According to the embodiment, each of the core layer and the first and second circuit layers individually comprises a plurality of conductive poles, the plurality of conductive poles of the core layer is arranged in a circle surrounding the chip container, and the plurality of conductive poles of the first circuit layer is arranged in a circle surrounding the through hole, and locations of the plurality of conductive poles of the core layer and the first and second circuit layers correspond to one another so as to provide electro-magnetic shielding to the chip. The plurality of conductive poles of the core layer and the first and second circuit layers respectively penetrates through the core layer and the first and second circuit layers and is electrically connected to one another.

According to the embodiment, each of the core layer and the first and second circuit layers individually comprises a ring-shaped conductive elements, the ring-shaped conductive element of the core layer surrounds the chip container, and the ring-shaped conductive element of the first circuit layer surrounds the through hole, and locations of the ring-shaped conductive elements of the core layer and the first and second circuit layers correspond to one another so as to provide electro-magnetic shielding to the chip. The ring-shaped conductive elements of the core layer and the first and second circuit layers respectively penetrates through the core layer and the first and second circuit layers and are electrically connected to one another.

According to the embodiment, for the embedded chip package structure, the chip has a back surface opposite to the active surface, and the second circuit layer comprises a plurality of heat dissipation columns penetrating through the second circuit layer and the plurality of heat dissipation columns is connected to a back surface of the chip.

According to the embodiment, the chip is a three-dimensional sensor chip.

According to the embodiment, the active surface of the chip comprises a first plane and a second plane parallel to each other, and the first plane is located within and on the protrusion of the chip and the second plane surrounds the protrusion.

According to the embodiment, the chip further comprises a plurality of electrodes disposed on the second plane and the first circuit layer is electrically connected to the plurality of electrodes.

According to the embodiment, a size of a projection of the through hole on the first surface is substantially equivalent to a size of a projection of the protrusion on the firs.

In view of above, the embedded chip package structure of this invention has a chip container in the core layer and a through hole in the first circuit layer to accommodate the chip within the core layer and the first circuit layer in order to decrease the total thickness of the package structure. In addition, the active surface of the protrusion of the chip is exposed through the through hole of the first circuit layer to receive the external signal. Compared with the faraday cage surrounding the chip, the conductive poles or ring-shaped conductive elements disposed within the core layer and the first and second circuit layers can provide electro-magnetic shielding to the chip, without increasing the size of the embedded chip package structure. Furthermore, the embedded chip package structure of this invention has a plurality of heat dissipation columns arranged within the second circuit layer and connected to the back surface of the chip, so that the heat generated by the chip can dissipate through the heat dissipation columns and the heat dissipation efficiency is greatly enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
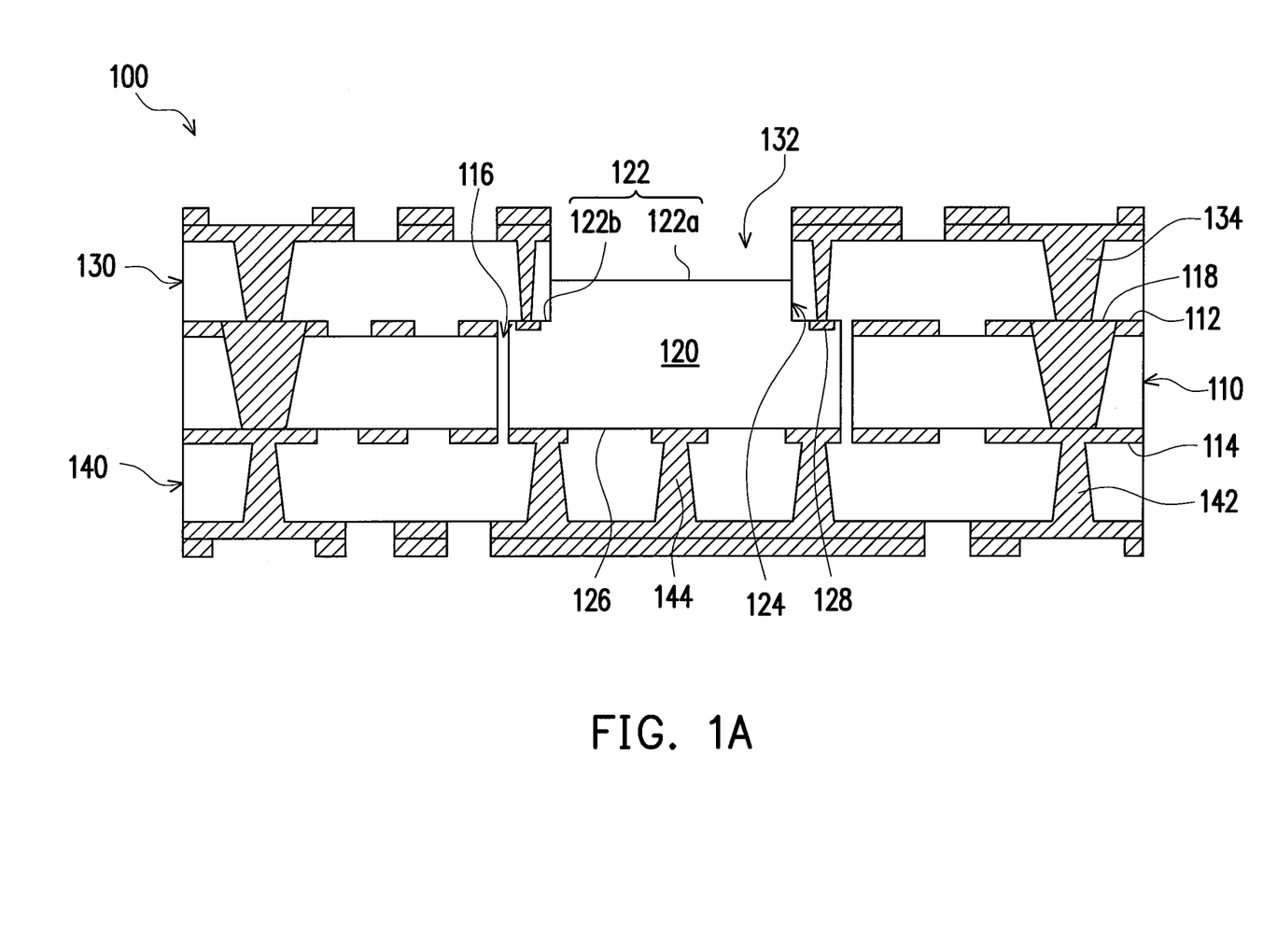
FIG. 1A schematically illustrates a cross-sectional view of an embedded chip package structure according to an embodiment of the present invention.

FIG. 1A schematically illustrates a cross-sectional view of an embedded chip package structure according to an embodiment of the present invention. Referring to FIG. 1A, the embedded chip package structure 100 includes a core layer 110, a chip 120, a first circuit layer 130 and a second circuit layer 140. The core layer 110 includes a first surface 112, a second surface 114 opposite to the first surface 112 and a chip container 116 passing through the first surface 112 and the second surface 114. The chip 120 is disposed in the chip container.

In this embodiment, the chip 120 includes an active surface 122 and a back surface 126 opposite to the active surface 122. The chip 120 also includes a protrusion 124 and a plurality of electrodes 128. The active surface 122 includes a first plane 122a and a second plane 122b, parallel to each other. A portion of the active surface 122 is located within and on the protrusion 124 (i.e. the first plane 122a), while the second plane 122b surrounds the protrusion 124. The electrodes 128 are disposed on the second plane 122b of the active surface 122.

The first circuit layer 130 is disposed on the first surface 112 of the core layer 110 and electrically connected to the core layer 110 and the electrodes 128 of the chip 120. The first circuit layer 130 has a through hole 132. In this embodiment, the size of the projection of the through hole 132 on the first surface 112 is substantially equivalent to the size of the projection of the protrusion 124. The protrusion 124 of the chip 120 is situated within the through hole 132, and the top surface of the protrusion 124 (i.e. the first plane 122a) is exposed by the through hole 132 to receive an external signal. The second circuit layer 140 is disposed on the second surface 114 of the core layer 110 and electrically connected to the core layer 110.

In this embodiment, the chip 120 may be a three-dimensional sensor chip for sensing the potential or light. However, the types of the chip 120 is not limited by the embodiment of this invention.

Figure 1B:
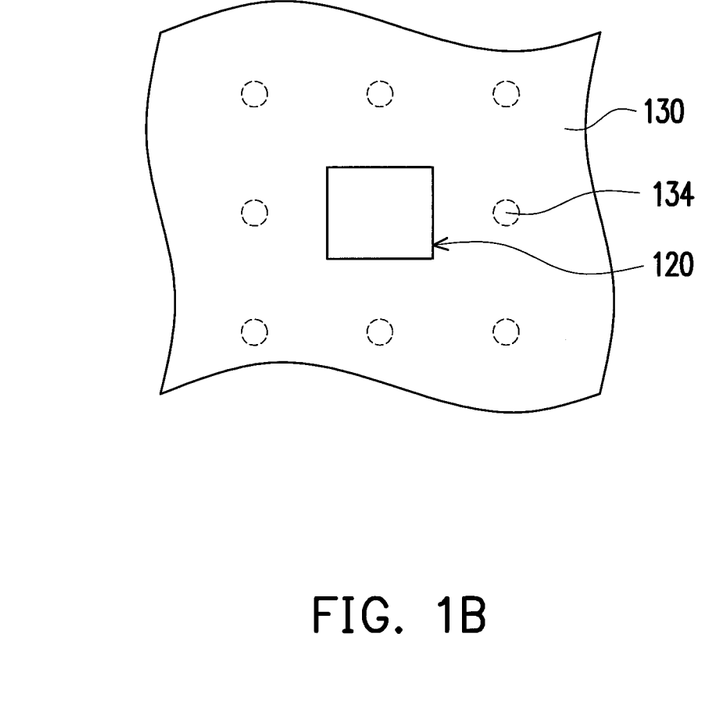
FIG. 1B schematically illustrates a top view of the embedded chip package structure of FIG. 1A.

FIG. 1B schematically illustrates a top view of the embedded chip package structure of FIG. 1A. In FIG. 1B, in order to show the relative position of the conductive pole(s) 118 and the chip 120, the other contact pads on the first circuit layer 130 are omitted for the conveniences of the descriptions. Referring to FIGS. 1A and 1B, the first and second circuit layers 130, 140 respectively include a plurality of conductive poles 118, 134 and 142. The conductive poles 118 of the core layer 110 are arranged in a circle and surrounding the chip container 116. The conductive poles 134 of the first circuit layer 130 are arranged in circle and surrounding the through hole 132. The conductive poles 142 of the second circuit layer 140 are arranged to align with the conductive poles 134. The locations of the conductive poles 118, 134 and 142 are arranged relatively to the location of the chip 120 (i.e. surrounding the chip 120), so as to provide electro-magnetic shielding.

As shown in FIG. 1A, the conductive poles 118, 134 and 142 penetrate through the core layer 110 and the first and second circuit layers 130 and 140 and are connected to one another. In this embodiment, the material of the conductive poles 118, 134 and 142 may be, but is not limited to, a metal.

Compared to the faraday cage occupying a large space and of a heavier weight, for the embedded chip package structure 100, the electro-magnetic interference of the chip 120 is lowered through the conductive poles 118, 134 and 142 surrounding the chip 120. As the conductive poles 118, 134 and 142 are embedded within the core layer 110 and the first and second circuit layers 130 and 140, the height of the embedded chip package structure 100 will not be increased, which is beneficial for the minimization of the embedded chip package structure 100.

Since the integration of the internal circuits of the chip 120 keeps increasing, the heat generated during the operation of the chip 120 also escalates. Heat dissipation of the chip 120 is required in order to avoid damages or efficiency downgrade from the high temperature and maintain the normal function of the chip. Referring back to FIG. 1A, the second circuit layer 140 includes a plurality of heat dissipation columns 144 penetrating through the second circuit layer 140. The locations of the heat dissipation columns 144 in the second circuit layer 140 correspond to the location of the chip 120 so that the heat dissipation columns 144 are connected to the back surface 126 of the chip 120. In this embodiment, the material of the heat dissipation columns 144 may be, but is not limited to, a metal, for example. The heat generated by the chip 120 can be dissipated from the back 126 of the chip 120 via the contact with the heat dissipation columns 144.

Figure 2A:
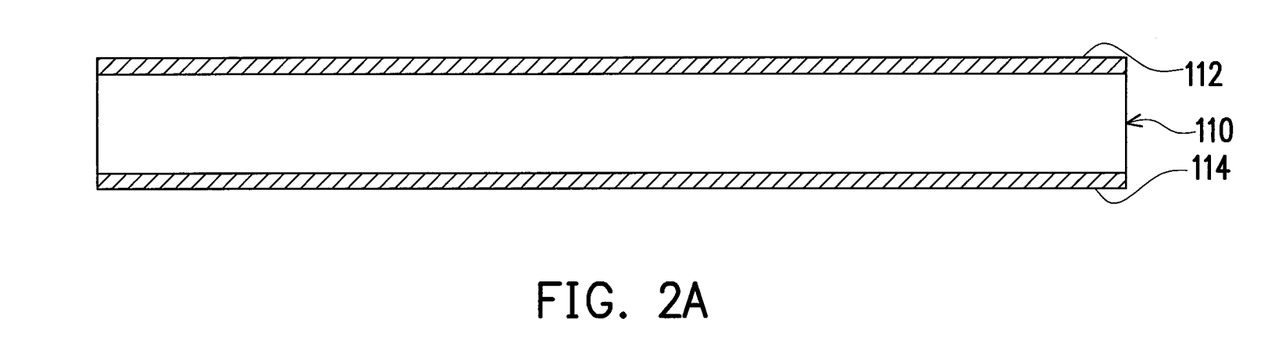
FIG. 2A-2M schematically illustrate the manufacturing processes of the embedded chip package structure according to an embodiment of the present invention.
Figure 2B:
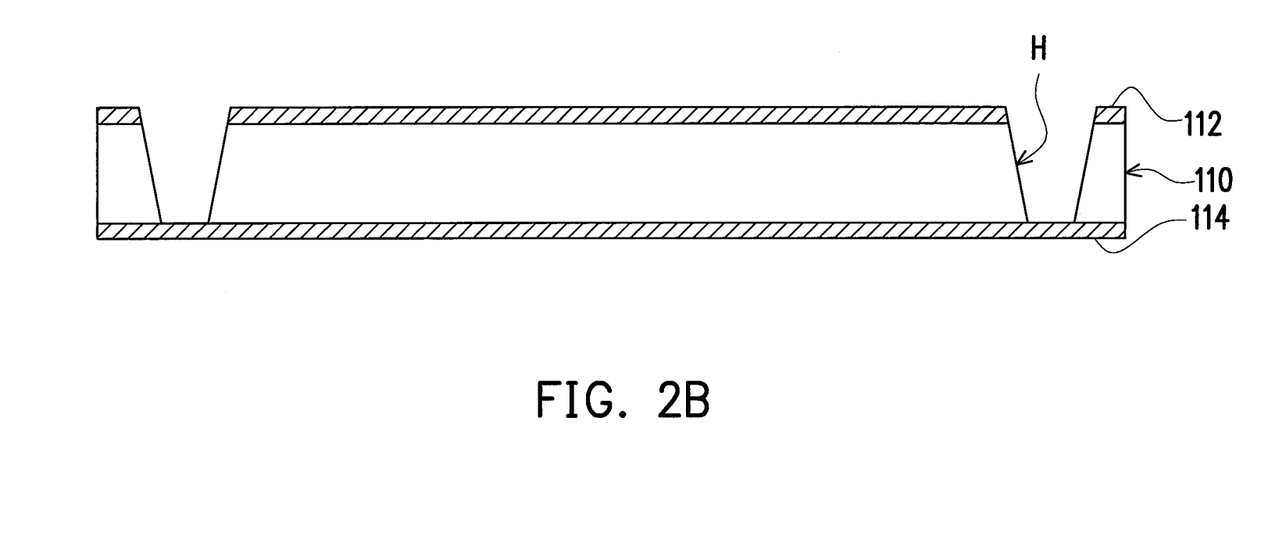
Figure 2C:
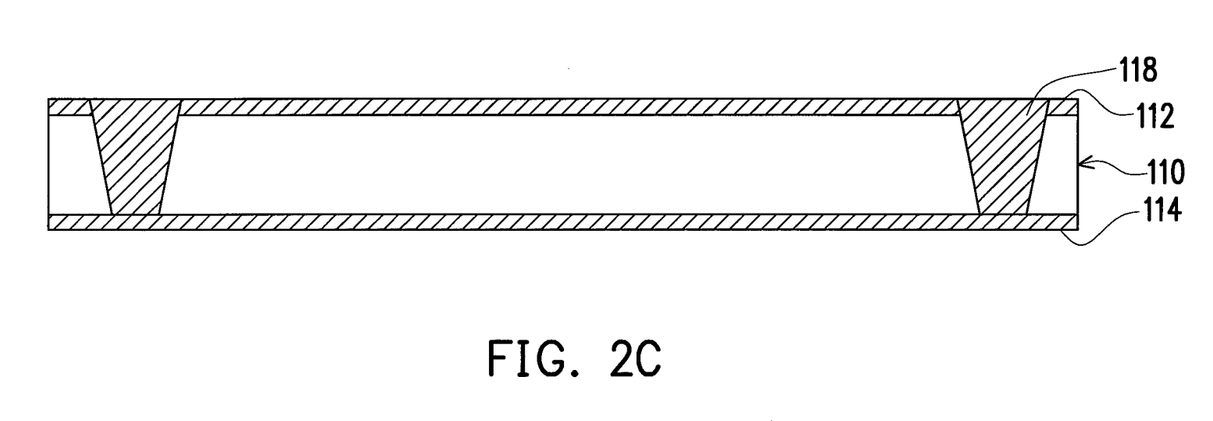
Figure 2D:
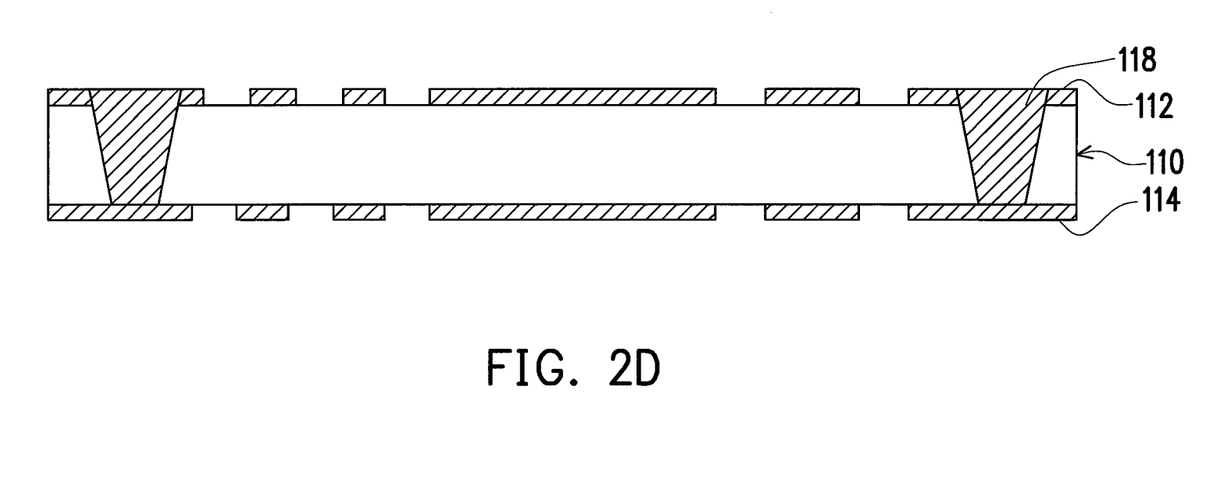
Figure 2E:
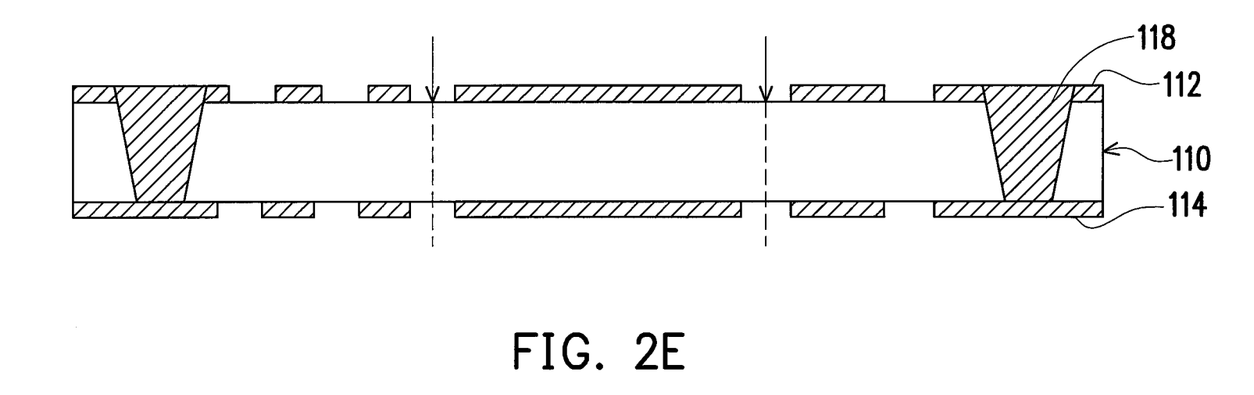
Figure 2F:
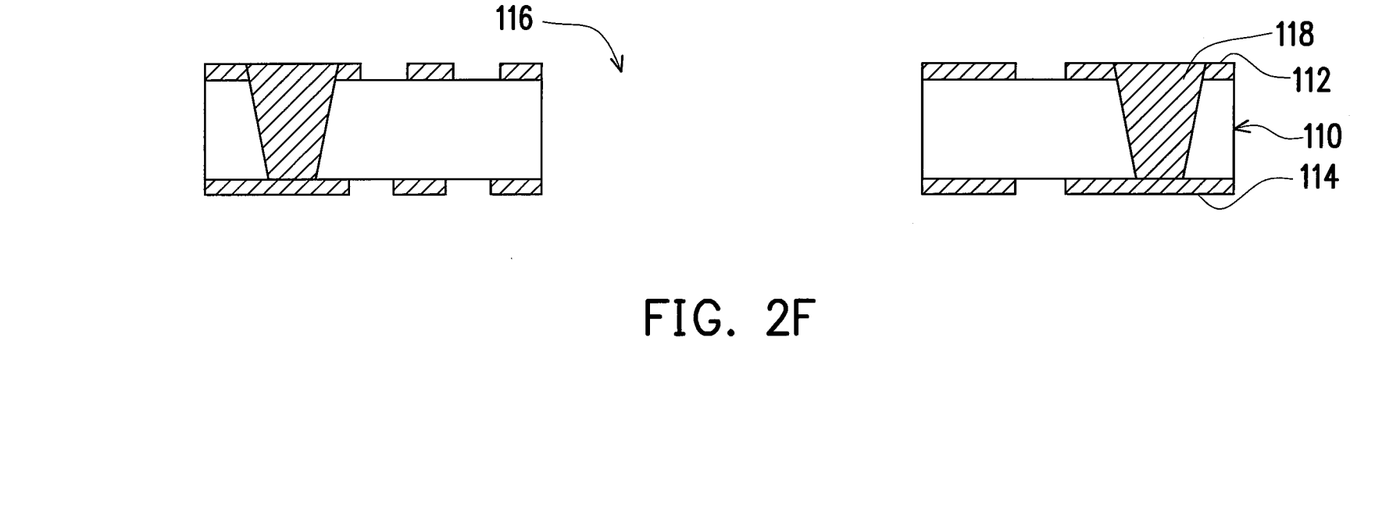

FIG. 2A-2M schematically illustrate the manufacturing processes of the embedded chip package structure according to an embodiment of the present invention. The embedded chip package structure of FIG. 1A is shown as an example herein. Referring to FIG. 2A, a core layer 110 is provided, and two outermost metal layers of the core layer 110 provides the first surface 112 and the second surface 114 opposite to the first surface 112. Later as shown in FIG. 2B, a plurality of through holes H is formed in the core layer 110, and a conductive material is deposited into the through holes H of the core layer 110 to form a plurality of conductive poles 118 (as shown in FIG. 2C). In this embodiment, the material of the conductive poles 118 may be, but is not limited to, a metal. Later, the first and second surfaces 112, 114 of the core layer 110 are etched to pattern the two outermost metal layers of the core layer 110, as shown in FIG. 2D. A portion of the core layer (along the dotted lines in FIG. 2E) is removed so that a chip container 116 penetrating through the first and second surfaces 112, 114 is formed in the core layer 110 (FIG. 2F).

Figure 2G:
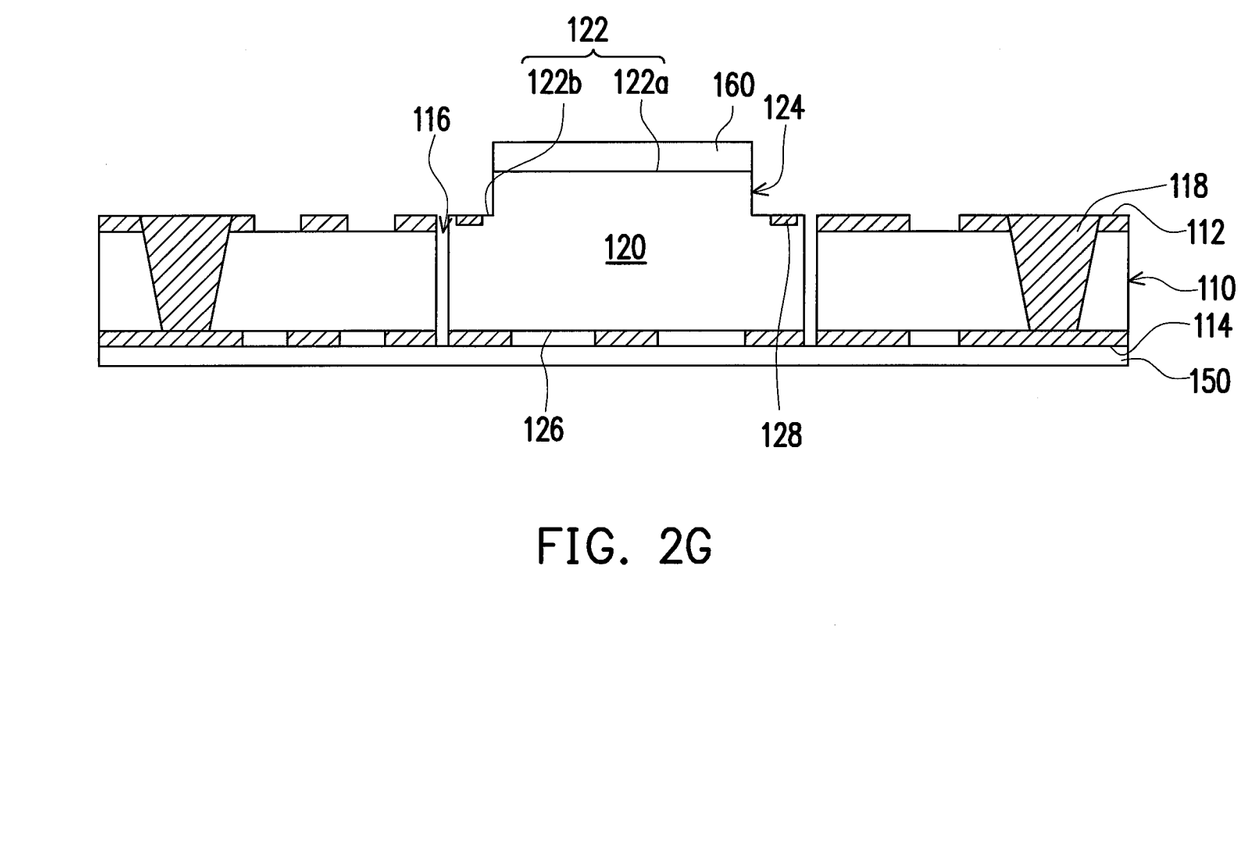

Then, referring to FIG. 2G, the chip 120 is placed within the chip container 116. The chip 120 includes an active surface 122 and a back surface 126 opposite to the active surface 122. The chip 120 also includes a protrusion 124 and a plurality of electrodes 128. The active surface 122 includes a first plane 122a and a second plane 122b, parallel to each other. A portion of the active surface 122 is located within the protrusion 124 (i.e. the first plane 122a), while the second plane 122b surrounds the protrusion 124. The electrodes 128 are disposed on the second plane 122b of the active surface 122. In FIG. 2G, the second surface 114 of the core layer 110 and the back surface 126 of the chip 120 are attached to an adhesion layer 150. A protective layer 160 is coated or laminated to the first plane 122a of the active surface 122, so that the chip 120 is protected from the acidic or basic etching during the wet processes. In this embodiment, the protective layer 160 may be a release film, but the types of the protective layer 160 is not limited to this embodiment.

Figure 2H:
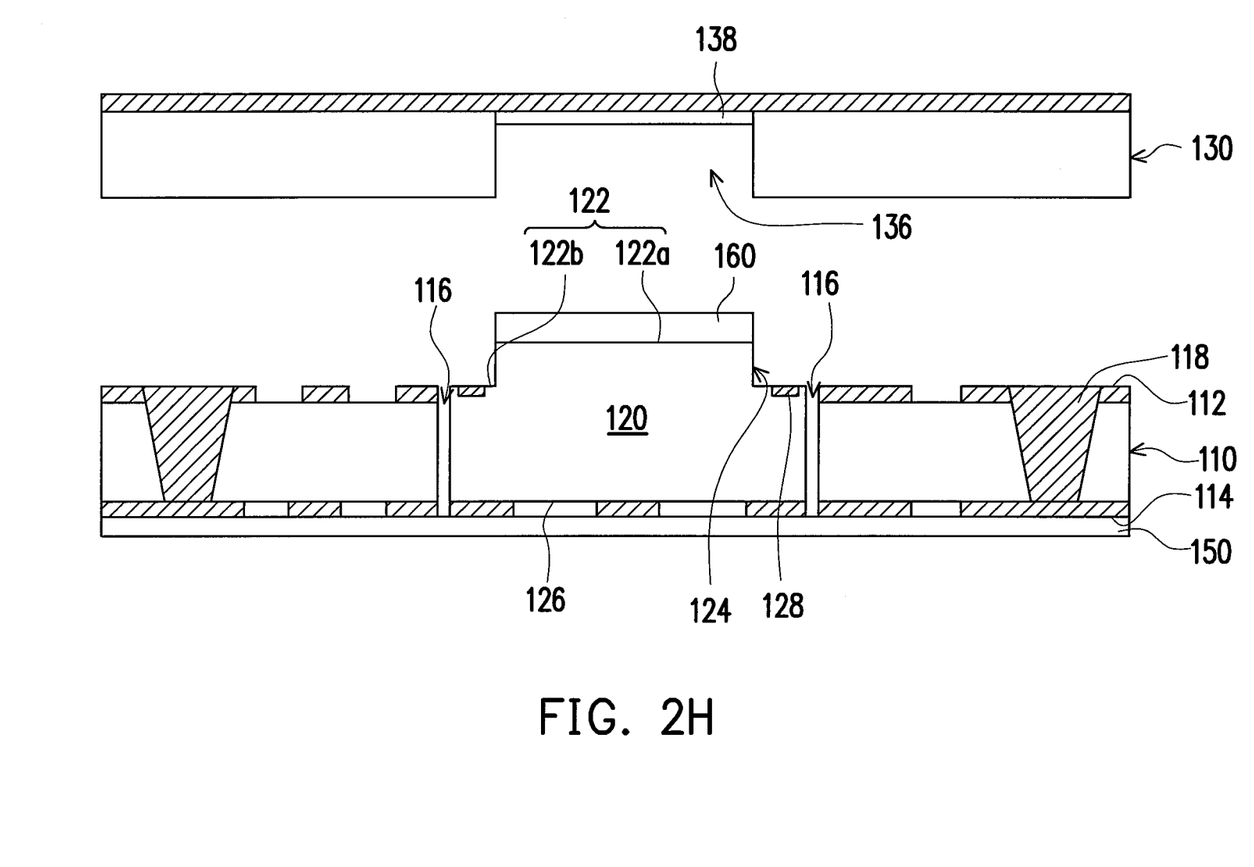
Figure 2I:
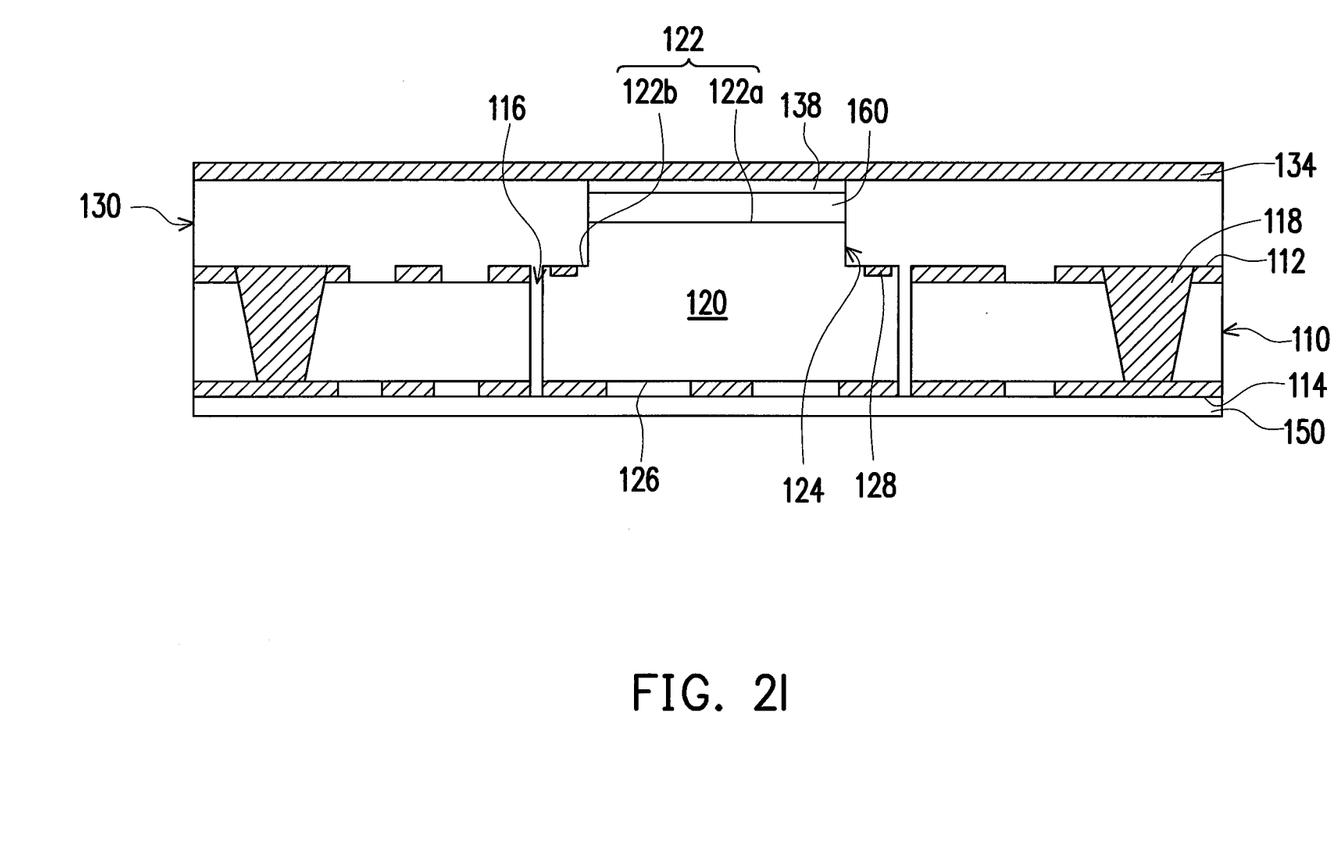
Figure 2J:
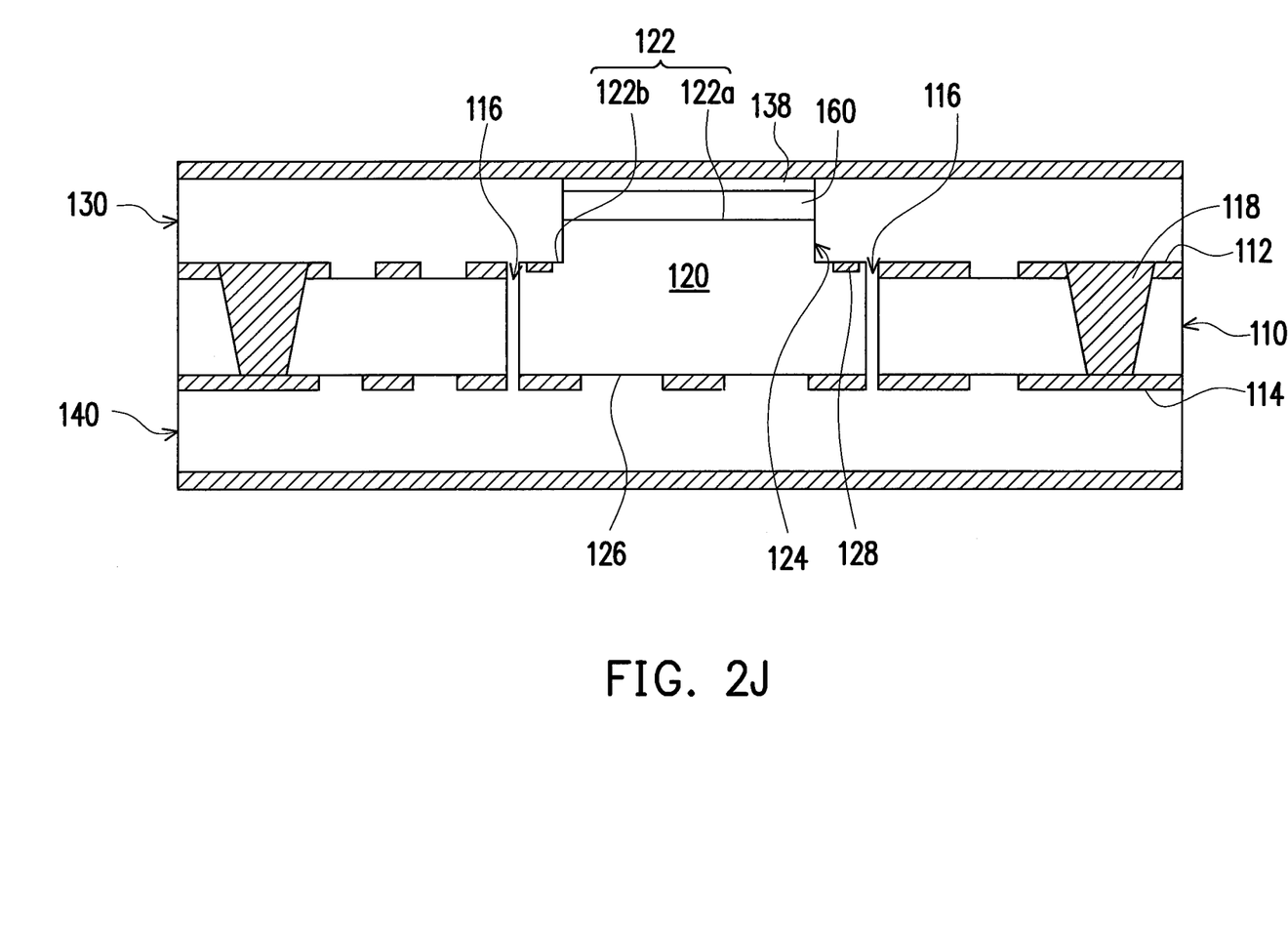

Referring to FIG. 2H-2I, the first circuit layer 130 is disposed on the first surface 112 of the core layer 110. The first circuit layer 130 includes a hole 136 that partially but not completely penetrating through the first circuit layer 130 and a template resin 138 disposed in the hole 136. During lamination, the protrusion 124 of the chip 120 fits into the hole 136 and contacts with the template resin 138. Then, the adhesion layer 150 is removed from the second surface 114 of the core layer 110 and the second circuit layer 140 is disposed onto the second surface 114 of the core layer 110, as shown in FIG. 2J. If only the first circuit layer 130 is laminated to the first surface 112 without laminating the second circuit layer 140 to the second surface 114, it is likely that warpage or distortion occurring to the package structure, the electrodes 128 of the chip 120 are detached from the first circuit layer 130 and the chip 120 is malfunctioned. Hence, in this embodiment, the second circuit layer 140 is disposed on the second surface 114 of the core layer 110.

Figure 2K:
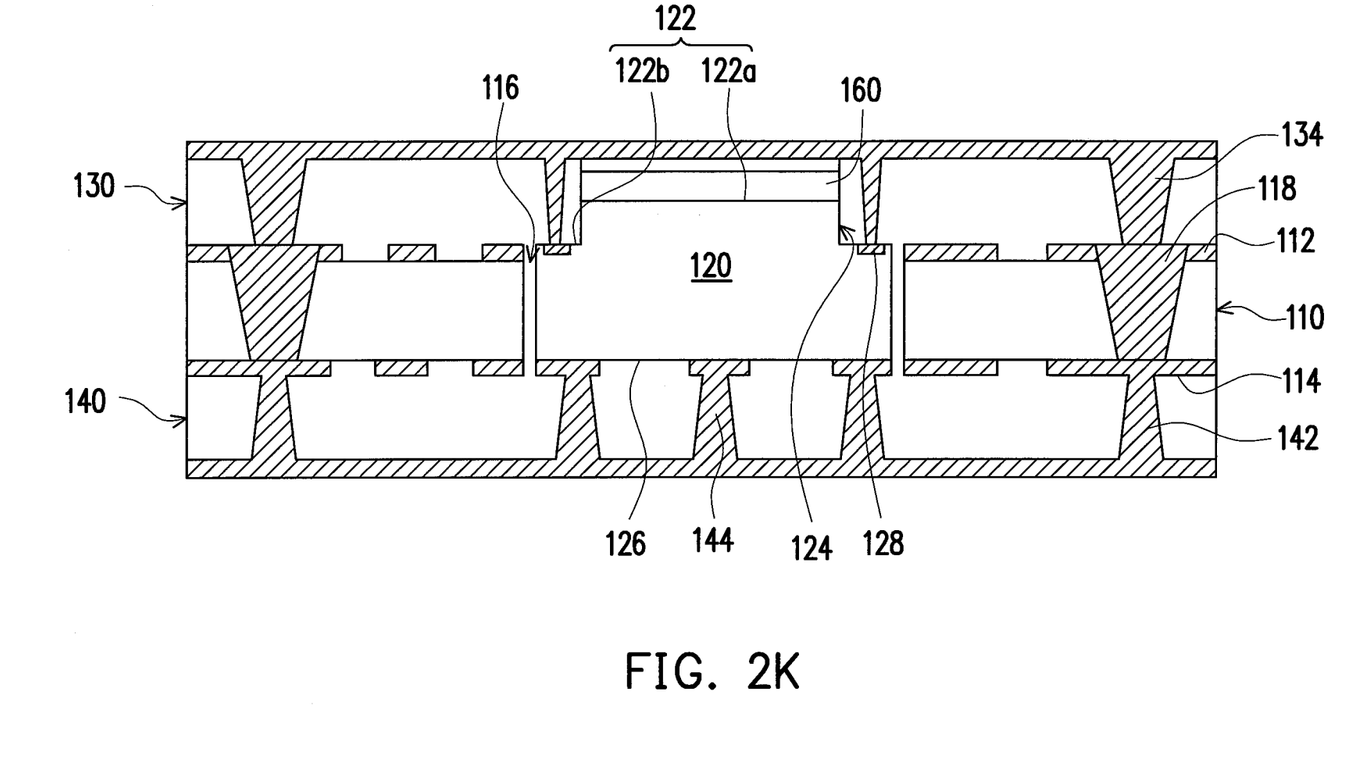

As shown in FIG. 2K, a plurality of conductive poles 134 and 142 is formed in the first and second circuit layers 130 and 140 and a plurality of heat dissipation columns 144 is formed in the second circuit layer 140. The locations of the conductive poles 118, 134 and 142 are arranged relatively to the location of the chip 120 (i.e. surrounding the chip 120), so as to provide electro-magnetic shielding. The locations of the heat dissipation columns 144 in the second circuit layer 140 correspond to the location of the chip 120 so that the heat dissipation columns 144 are connected to the back surface 126 of the chip 120.

Figure 2L:
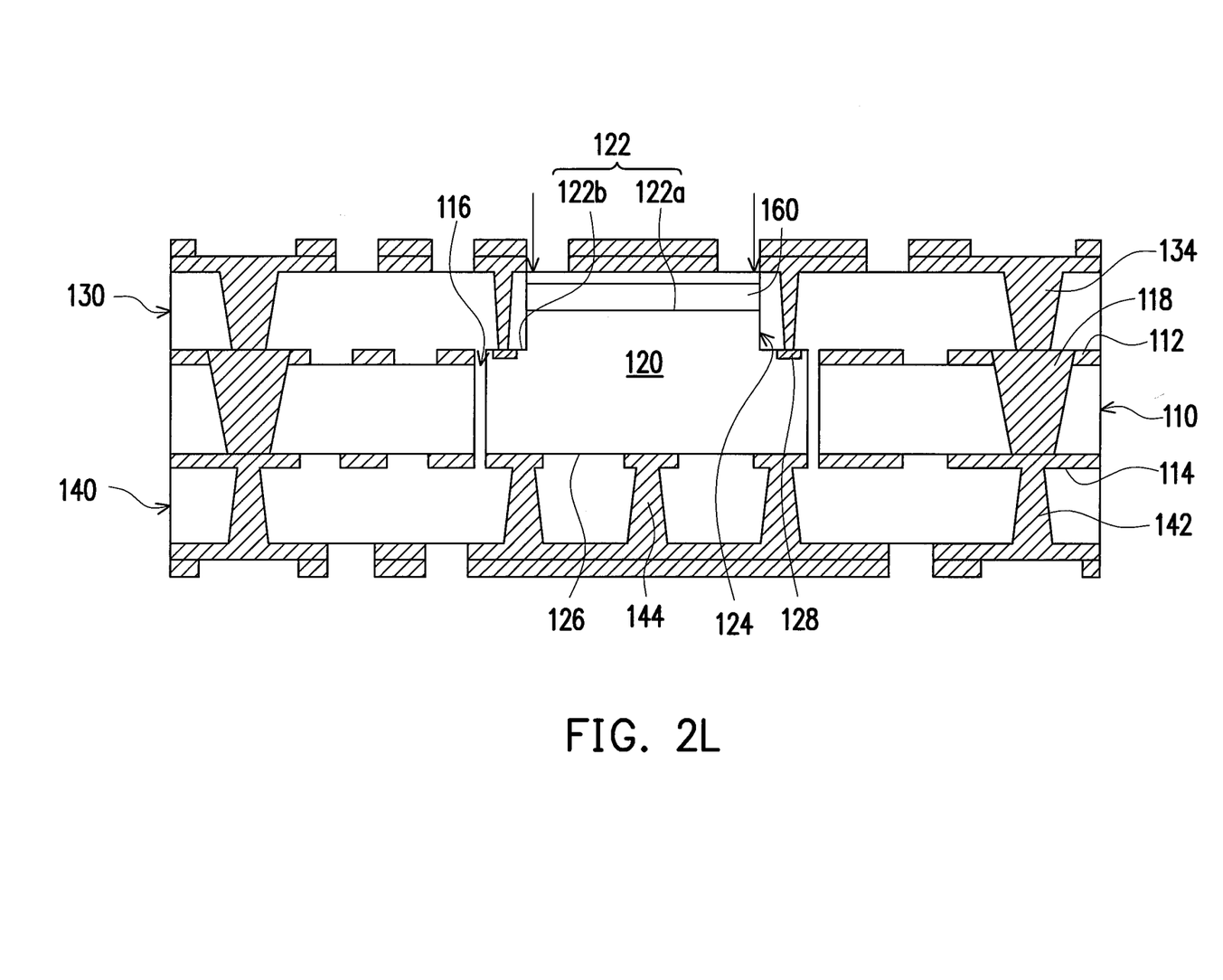
Figure 2M:
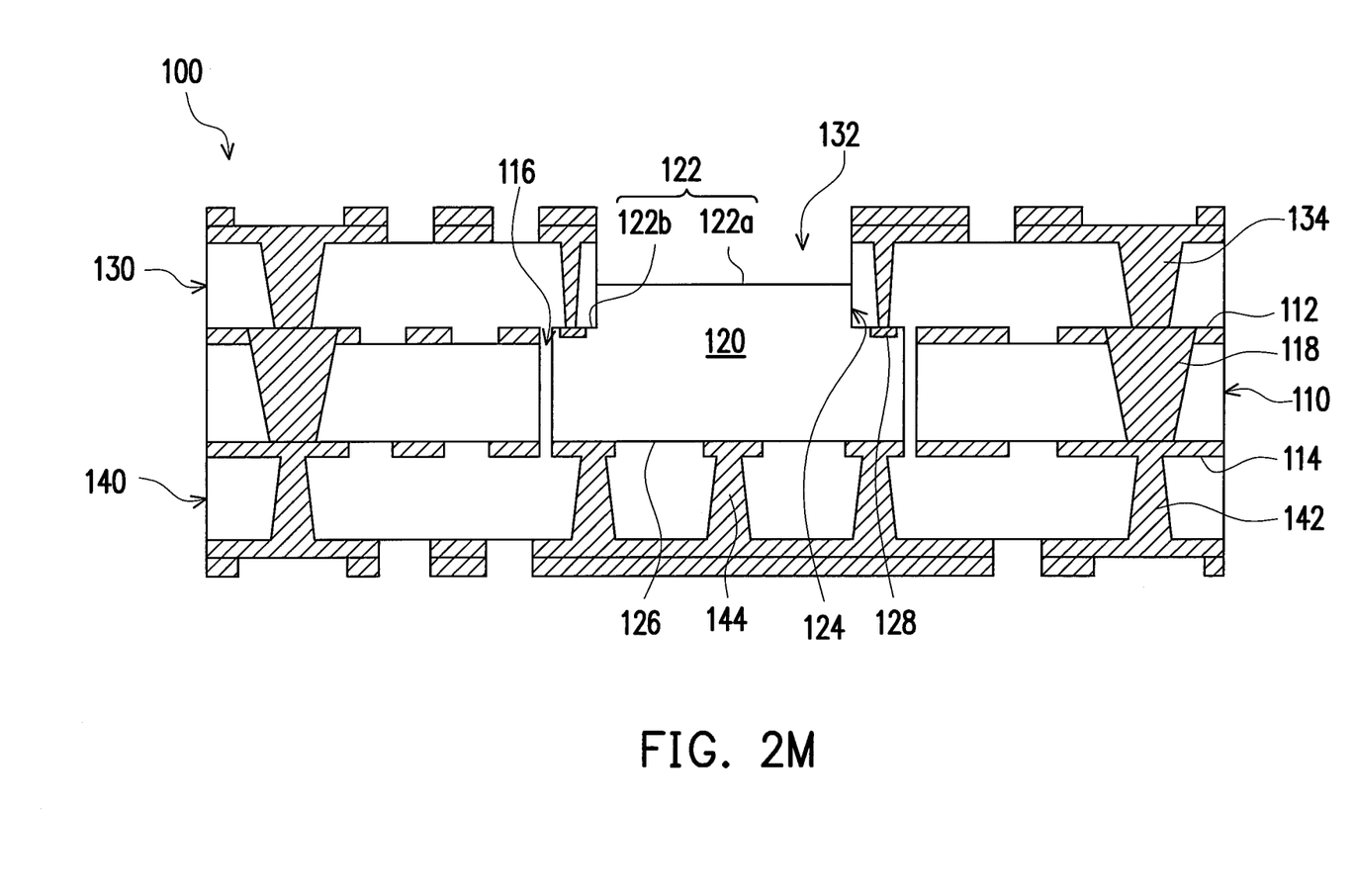

Then, referring to FIG. 2L-2M, a portion of the first circuit layer 130 that corresponds to the first plane 122a is removed along with the removal of the protective layer 160. Hence, the first plane 122a of the protrusion 124 of the chip 120 is exposed by the through hole 132 of the first circuit layer 130. In this embodiment, the portion of the first circuit layer 130 that corresponds to the first plane 122a is removed by laser and the protective layer 160 is removed by suction. Due to the protective layer 160 on the first plane 122a, the active surface 122 of the chip 120 will not be damaged during the removal of the portion of the first circuit layer 130.

Compared to the chip soldering to the circuit board, the chip 120 of this embodiment is embedded in the core layer 110 and the first circuit layer 130, which effectively decreases the thickness of the package and increases the surface layout area of the first circuit layer 130.

Figure 3A:
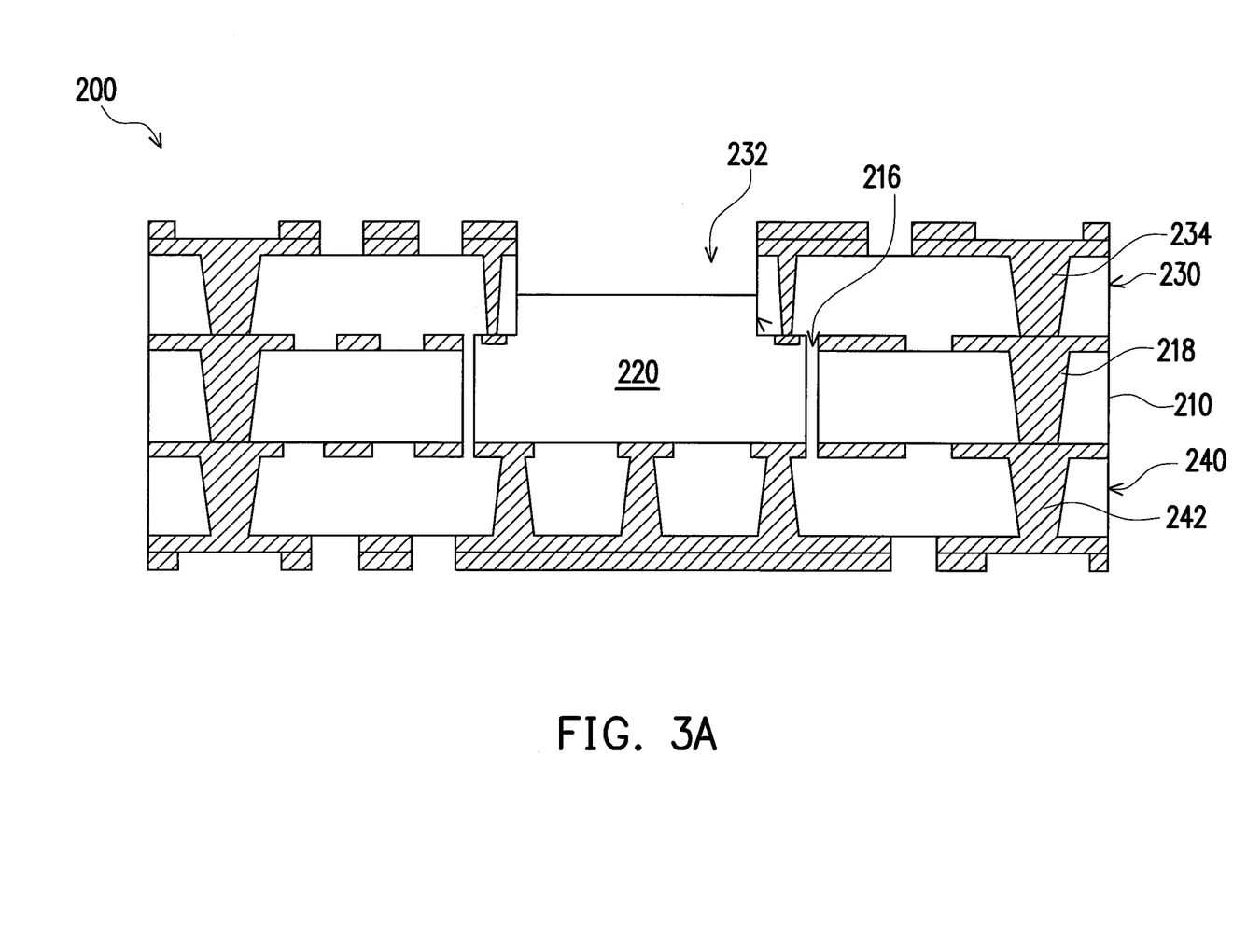
FIG. 3A schematically illustrates a cross-sectional view of an embedded chip package structure according to another embodiment of the present invention.
Figure 3B:
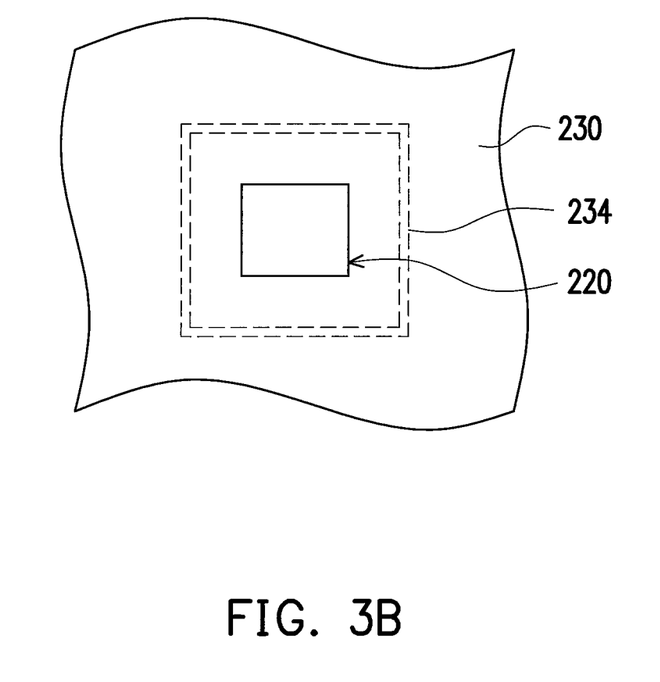
FIG. 3B schematically illustrates a top view of the embedded chip package structure of FIG. 3A.

FIG. 3A schematically illustrates a cross-sectional view of an embedded chip package structure according to another embodiment of the present invention, while FIG. 3B schematically illustrates a top view of the embedded chip package structure of FIG. 3A. Referring to FIGS. 3A and 3B, the embedded chip package structure 200 includes a core layer 210, a chip 220, a first circuit layer 230 and a second circuit layer 240. Different from the package structure 100, the core layer 210, the first circuit layer 230 and the second circuit layer 240 of the embedded chip package structure 200 respectively includes a ring-shaped conductive element 218, 234 and 242. The conductive element 218 of the core layer 210 is arranged to surround the chip container 216. The conductive element 234 of the first circuit layer 230 is arranged to surround the through hole 232, while the conductive element 242 of the second circuit layer 240 is arranged to align with the conductive element 234. The locations of the conductive elements 218, 234 and 242 are arranged relatively to the location of the chip 220 (i.e. surrounding the chip 220), so as to provide electro-magnetic shielding. In this embodiment, these conductive elements 218, 234 and 242 penetrate through the core layer 210 and the first and second circuit layers 230 and 240 and are connected to one another.

In FIG. 1B, the electro-magnetic shielding of the chip 120 of the embedded chip package structure 100 is provided through the conductive poles 118, 134 and 142 surrounding the chip 120. In this embodiment, the electro-magnetic shielding of the chip 220 of the embedded chip package structure 200 is provided through the ring-shaped conductive poles 218, 234 and 242 surrounding the chip 220. However, the electro-magnetic shielding of the chip may be achieved through other forms of shielding elements and are not limited to the examples described herein.

The embedded chip package structure of this invention has a chip container in the core layer and a through hole in the first circuit layer to accommodate the chip within the core layer and the first circuit layer in order to decrease the total thickness of the package structure. In addition, the active surface of the protrusion of the chip is exposed through the through hole of the first circuit layer to receive the external signal. Compared with the faraday cage surrounding the chip, the conductive poles or ring-shaped conductive elements disposed within the core layer and the first and second circuit layers can provide electro-magnetic shielding to the chip, without increasing the size of the embedded chip package structure. Furthermore, the embedded chip package structure of this invention has a plurality of heat dissipation columns arranged within the second circuit layer and connected to the back surface of the chip, so that the heat generated by the chip can dissipate through the heat dissipation columns and the heat dissipation efficiency is greatly enhanced.

This invention has been disclosed above in several embodiments, but is not limited to those. It is known to persons skilled in the art that some modifications and innovations may be made without departing from the spirit and scope of this invention. Hence, the scope of this invention should be defined by the following claims.

What is claimed is:

1. An embedded chip package structure, comprising:
   a core layer, wherein the core layer includes a first surface, a second surface opposite to the first surface and a chip container passing through the first surface and the second surface;
   a chip, disposed in the chip container, wherein the chip includes an active surface and a protrusion and a top surface of the protrusion is a portion of the active surface;
   a first circuit layer, disposed on the first surface and electrically connected to the core layer and the chip, wherein the first circuit layer has a through hole, and a width of the through hole is smaller than a width of the chip container, so that the first circuit layer covers the chip except the protrusion, wherein the protrusion of the chip extends into the through hole and is located within the through hole, and the top surface of the protrusion is exposed to receive an external signal, and a size of a projection of the through hole on the first surface is substantially equivalent to a size of a projection of the protrusion on the first surface; and
   a second circuit layer, disposed on the second surface and electrically connected to the core layer.

2. The chip package structure of claim 1, wherein each of the core layer and the first and second circuit layers individually comprises a plurality of conductive poles, the plurality of conductive poles of the core layer is arranged in a circle surrounding the chip container, and the plurality of conductive poles of the first circuit layer is arranged in a circle surrounding the through hole, and locations of the plurality of conductive poles of the core layer and the first and second circuit layers correspond to one another so as to provide electro-magnetic shielding to the chip.

3. The chip package structure of claim 2, wherein the plurality of conductive poles of the core layer and the first and second circuit layers respectively penetrates through the core layer and the first and second circuit layers and is electrically connected to one another.

4. The chip package structure of claim 1, wherein each of the core layer and the first and second circuit layers individually comprises a ring-shaped conductive elements, the ring-shaped conductive element of the core layer surrounds the chip container, and the ring-shaped conductive element of the first circuit layer surrounds the through hole, and locations of the ring-shaped conductive elements of the core layer and the first and second circuit layers correspond to one another so as to provide electro-magnetic shielding to the chip.

5. The chip package structure of claim 4, wherein the ring-shaped conductive elements of the core layer and the first and second circuit layers respectively penetrates through the core layer and the first and second circuit layers and are electrically connected to one another.

6. The chip package structure of claim 1, wherein the chip has a back surface opposite to the active surface, and the second circuit layer comprises a plurality of heat dissipation columns penetrating through the second circuit layer and the plurality of heat dissipation columns is connected to a back surface of the chip.

7. The chip package structure of claim 1, wherein the chip is a three-dimensional sensor chip.

8. The chip package structure of claim 1, wherein the active surface comprises a first plane and a second plane parallel to each other, and the first plane is located within and on the protrusion of the chip and the second plane surrounds the protrusion.

9. The chip package structure of claim 8, wherein the chip further comprises a plurality of electrodes disposed on the second plane and the first circuit layer is electrically connected to the plurality of electrodes.

* * * * *